United States Patent [19]

Liu

[11] 4,299,906

[45] Nov. 10, 1981

[54] LIGHT-SENSITIVE COLOR PROOFING FILM WITH SURFACTANT IN A LIGHT-SENSITIVE COATING

[75] Inventor: Shuchen Liu, Clinton, N.J.

[73] Assignee: American Hoechst Corporation, Somerville, N.J.

[21] Appl. No.: 154,737

[22] Filed: May 30, 1980

Related U.S. Application Data

[63] Continuation-in-part of Ser. No. 45,468, Jun. 1, 1979, abandoned.

[51] Int. Cl.³ .................... G03C 1/78; G03C 1/60; G03C 1/68
[52] U.S. Cl. ........................... 430/157; 435/155; 430/165; 430/175; 430/177; 430/191; 430/169; 430/271; 430/281; 430/285; 430/286; 430/293; 430/294; 430/637; 430/910; 430/280
[58] Field of Search ............ 430/155, 293, 294, 358, 430/175, 176, 177, 178, 191, 637, 169, 331, 271, 287, 288, 280, 253, 254, 281, 285, 286, 910, 157, 165

[56] References Cited

U.S. PATENT DOCUMENTS

| | | | |
|---|---|---|---|
| 2,544,903 | 3/1951 | Staehle | 430/294 |
| 2,807,545 | 9/1957 | Frederick | 430/177 |
| 3,060,022 | 10/1962 | Duerr | 430/253 |
| 3,130,050 | 4/1964 | Schwerir | 430/294 |
| 3,197,308 | 7/1965 | Stahlofen | 430/287 |
| 3,458,311 | 7/1969 | Alles | 430/273 |
| 3,586,504 | 6/1971 | Coates et al. | 430/331 |
| 3,681,074 | 8/1972 | Post | 430/189 |
| 3,785,817 | 1/1974 | Kuchta | 430/253 |
| 3,868,254 | 2/1975 | Wemmers | 430/191 |
| 3,895,950 | 7/1975 | Geiger et al. | 430/637 |
| 4,028,111 | 6/1977 | Iwasaki et al. | 430/191 |
| 4,092,170 | 5/1978 | Houtermans et al. | 430/175 |
| 4,101,323 | 7/1978 | Bhur et al. | 430/270 |
| 4,157,918 | 6/1979 | Wanat et al. | 430/175 |
| 4,220,700 | 9/1980 | McGuckin et al. | 430/175 |
| 4,233,391 | 11/1980 | Okai et al. | 430/288 |

Primary Examiner—Charles L. Bowers, Jr.
Attorney, Agent, or Firm—Leo S. Burnett

[57] ABSTRACT

A color proofing foil of increased developability is provided which comprises a substantially transparent polymeric base sheet having a thin coating of a light sensitive composition on the surface of said sheet comprising a mixture of a colorant, a light sensitive material and an effective amount of anionic surfactant. The anionic surfactant is obtained by the reaction of $P_2O_5$ with a condensation product of an alkylene oxide and an organic compound containing a reactive hydrogen. The light sensitive coating compositions of this invention when positive working exhibit greatly increased exposure speed. When negative working they exhibit increased development speed. In both cases, they retain the required good adhesion to film substrates, good scratch resistance, freedom from tack and acceptable resistance to overdevelopment.

16 Claims, No Drawings

LIGHT-SENSITIVE COLOR PROOFING FILM WITH SURFACTANT IN A LIGHT-SENSITIVE COATING

This application is a continuation-in-part of Ser. No. 045468, filed June 1, 1979, now abandoned.

DESCRIPTION

BACKGROUND OF THE INVENTION

The present invention relates to color proofing foils and refers more particularly to methods and materials for making color proofing foils of dark colors of improved developability from light sensitive materials.

U.S. Pat. No. 3,326,682 teaches that positive working color proofing foils can be prepared by coating o-quinone diazide photosensitizers and colorants, with or without resins and other additives, upon a transparent support, preferably polyethylene glycol terephthalate. In the practice of the above patent, the contents of which are explicitly made part of this application by reference, excellent color separation overlay proofing materials have been made from positive silver halide color separations used as exposure masks upon the appropriate colored proofing foil. After exposure and development in dilute aqueous alkali, the foils may be viewed individually and then placed one above the other on top of a white reflecting support to give a preview of the print which is to be made from plates from the aforementioned color separation silver halide positives.

A black coated foil is customarily used as one of the layers to add depth of color beyond that which would be obtained from a three color separation restricted solely to cyan, magenta and yellow. It has been found by experience that when a black dye or pigment is added to the foil coating composition, a great increase in required exposure results due to the absorption of light by the black dye or pigment. Dark colored foils, either black or other dark colors, similarly require undesirably increased exposure.

In the case of the black in positive systems, one approach to reduced exposure has been to reduce the level of dye or black pigment. This has the undesirable effect of giving a medium gray or light gray rather than deep, rich, black which would be preferred. These considerations also apply to other dark colors, which may be used apart from multicolor proofing processes in the graphic arts.

Still another approach to overcoming the exposure increase resulting from the full quantity of black dye or pigment is disclosed in U.S. Pat. No. 4,154,613. According to this invention, it was found that an overall exposure to light prior to or after imagewise exposure results in a highly desirable reduction of required imagewise exposure even though the dye or pigment level in the coating was at the desired level required for full, deep, rich colors. However, special equipment and an added process step is required.

A recent development in the technology of color proofing has been the introduction of automatic exposure and development machinery. With the use of such equipment, it is desirable that foils of all colors either deeply or lightly tinted have the same exposure speed and development characteristics, in order to avoid individual manual attention in processing. With the exception of the aforementioned technique of overall pre or postexposure, there has existed no convenient method of adjusting the exposure speed of the various differently colored proofing foils.

Therefore, one object of the present invention is to provide methods and materials for making color proofing foils which overcome the disadvantages of the prior art.

Another object is to provide novel light sensitive materials for making color proofing foils of increased light sensitivity.

Another object is to provide novel light sensitive materials for making color proofing foils in which exposure speed can be varied independently of the color selected.

Still another object is to provide foils of improved developability in which the required development time may be adjusted so that it is the same for all colors.

SUMMARY OF THE INVENTION

The present invention provides a light sensitive material for making a color proofing foil of increased developability which comprises a substantially transparent polymeric base sheet having a thin coating of a light sensitive composition on the surface of said sheet, said composition comprising a mixture of a colorant, a light sensitive material and an effective amount of an anionic surfactant. The anionic surfactant is obtained by the reaction of $P_2O_5$ with a condensation product of an alkylene oxide and an organic compound containing a reactive hydrogen. The light sensitive coating compositions of this invention when positive working exhibit greatly increased exposure speed. When negative working they exhibit increased development speed. In both cases they retain the required good adhesion to film substrates, good scratch resistance, freedom from tack and acceptable resistance to overdevelopment.

DETAILED DESCRIPTION

The components of the light sensitive coating compositions of the present invention other than the anionic surfactant may be the conventional components which are known in the art for such coatings used in positive acting and negative acting light sensitive systems. It is important to choose surfactants which are compatible with the components of both the coating solution as well as the final dried coating in order that the image areas on the proof sheet be as transparent as possible so that the color values are not affected by evidences of incompatibility.

In positive working systems, it is in the black and the very dark colors that the greatest reduction in exposure speed occurs compared to previous compositions. It is in these dark colors that the major gain in exposure speed results when anionic surfactants are added to the coating composition.

In negative working systems, the addition of the anionic surfactants according to this invention results in a shortening of development time, particularly with dark colors. Exposure speed remains substantially unchanged.

The anionic surfactants of this invention are complex organic phosphate esters of nonionic surfactants which are obtained as the reaction products of about one mole of $P_2O_5$ with about 2 to 4.5 moles of a condensation product of at least about one mole of an alkylene oxide having 2-4 carbon atoms with one mole of a compound containing about 6 to 150 carbon atoms and a reactive hydrogen atom and selected from the group consisting of phenol, alkyl phenols, aliphatic alcohols, fatty acids, fatty amines, fatty amides, rosin amines, long chain sulfonamides, and high molecular weight mercaptans, said reaction product being prepared under substantially anhydrous conditions and at a temperature below about 110° C. down to about room temperature.

Preferred anionic surfactants for reaction with $P_2O_5$ are those which are the condensation productions of ethylene oxide and the above mentioned organic compounds possessing an active hydrogen. Anionic surfactant compositions similar to those described therein are disclosed in U.S. Pat. No. 3,004,056, the disclosure of which is incorporated herein by reference.

More particularly preferred anionic surfactants in this invention are represented by formulas I and II below:

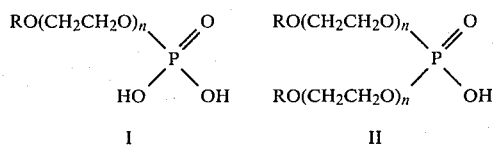

and mixtures thereof, where R=alkyl or alkylaryl radical and N=average number of moles of ethylene oxide ranging from 1 to 32.

Commercially available anionic surfactants made in accordance with the description above are supplied by GAF Corportion and referred to as GAFAC ® Surfactants and GAFSTAT ® antistats. These materials are mainly liquids although some are waxy pastes. They range from 89% to 100% active products. Their specific gravity ranges from about 1.00 to about 1.25. Their pour points, ASTM range from about >0° C. to about 30° C., while their acid numbers, defined as mg KOH/g of product to the 1st inflection point, range from about 30 to about 400.

Such anionic surfactants are described in a brochure entitled GAFAC ® Anionic Surfactants (9643-018-3M66) issued by the GAF Corporation in 1976.

In the group of GAFAC ® Surfactants, the members GAFAC ® PE-510, RE-610, and RE-870 all share the same chemical abstracts registry number 57811-79-1 and are assigned the same structure: poly (oxy-1,2-ethanediyl), -(nonyl phenyl)- -hydroxy, phosphate. In these three cases, the average length of the ethylene oxide chain must differ as the three materials have different physical properties.

When nonionic or cationic surfactants were evaluated, they proved either incompatable or did not improve developability.

Additional commercially available anionic surfactants corresponding to the above description are supplied by Finetex, Inc. and are known as Findets. They are described in Technical Data Sheets entitled Findet SB, Findet OJ-P, Findet GC. Only those compounds with free acid groups are effective.

The activity of the surfactants differs widely. Broadly, they are effective at a concentration of about 0.5% to 60% by weight. Some are active at low concentrations and may require that too high concentrations be avoided as it has been observed that in these cases the image will be attacked or even removed during development. Conversely, higher concentrations of less active surfactants may be required. There is therefore for each surfactant an optimum range which can readily be determined by the skilled artisan. More particularly preferred surfactants are GAFAC ® RE-610, RE-870, PE-510, RA 600, and GAFSTAT ® AS-710. The properties defining these surfactants are recited in the table following Example 13.

Binder resins, plasticizers, activators, and other customary additives may be included in the coating but, such additives are not normally required in positive working systems.

In negative acting systems, the binder material may be relatively inert to photochemical reaction, serving merely as a carrier for the light sensitive materials, colorants, and other additives which may be present in the coating composition. Exemplary of suitable binder materials include cellulose esters such as cellulose acetate, cellulose acetate succinate and cellulose acetate butyrate; polyvinyl acetals such as polyvinylbutryal and polyvinyl formal; polyamide resins; copolymers of vinyl chloride with polar monomers such as acrylonitrile, acrylic or methacrylic acid or their esters, and with vinyl acetate; polymeric esters such as polyvinyl acetate or copolymers of vinyl acetate with acrylic acid, methacrylic acid and their esters, or with maleic acid or maleic anhydride, copolymers of styrene with acid functional comonomers such as ethyl acrylate, vinyl acetate and maleic anhydride; natural polymers such as gelatin, casein or fish glue; polyvinyl alcohol; polyacrylamides; and like materials.

In a positive acting system, the resinous binder materials may be alkali soluble resins such as phenol/formaldehyde novolak resins and like materials, but styrene maleic anhydride copolymers may also be employed, as well as acrylic polymers.

The coloring agents employed in the present invention include those dyestuffs and pigments which are known in the art and which have colors substantially identical with the standard colors of inks required for color proofing, e.g., yellow, cyan, magenta and black. Examples of suitable colorants include Grasol Fast Yellow 5GL (C.I. Solvent Yellow 27), Grasol Fast Rubine 2BL (C.I. Solvent Red 128), Victoria Pure Blue FGA (C.I. Basic Blue 81), Neozapon Yellow GG (C.I. Solvent Yellow 79), Neozapon Fast Red BE (C.I. Solvent Red 122), Sudan Blue II (C.I. Solvent Blue 35-C.I. 61554 (S)), Victoria Cyan F6G (C.I. 42025), Rhodamine RB (C.I. 45170), Rhodamine 6GDN Extra (C.I. 45160), Auramine Concentrate (C.I. 41000), carbon black and like materials.

Additional suitable dyes include Orasol Yellow 3GLG (Ciba Geigy), Orasol Black, Rhodamine FB (BASF), Rhodamine 6GDN Extra (BASF), Victoria Pure Blue FGA (BASF), CI Solvent Yellow 48, CI Solvent Black 29, CI Basic Violet 10, CI Basic Red 1, CI Basic Blue 81.

Typical of the light sensitive compositions found suitable for the purposes of this invention are iminoquinone diazides, quinone diazides, and condensation products of aromatic diazonium compounds together with appropriate binders. Such sensitizers are described in U.S. Pat. Nos. 3,175,906, 3,046,118, 2,063,631, 2,667,415, 3,867,147 with the compositions disclosed in the last patent being in general preferred.

Diazonium compounds for use in this invention include mixed condensation products of 4-aminodiphenylamine and substituted 4-aminodiphenylamines (in the form of their salts) with formaldehyde and a second component, including among others, substituted phenols and phenol ethers.

Suitable mixed condensation products include those obtained by condensing a diphenylamine-4-diazonium salt with formaldehyde and either phenol, 4-hydroxycinnamic acid, mesitylene, or 2-phenoxy-ethanol. Alternatively, 3-methoxy-diphenylamine-4-diazonium salt is condensed with formaldehyde and either 4-nitrodiphenyl, 2,6-dimethylol-4-methylphenol, 4,4′-dimethoxy dimethyl diphenylether or 1,3diisopropyl-4,6-dimethylolbenzene. As a further alternative, 2,5-dimethoxy-4-phenoxybenzene diazonium salt is condensed with formaldehyde and 1,3-diisopropyl-4,6,dimethoxymethyl benzene. These mixed condensates are negative-working compounds.

Further suitable are photopolymer systems. Such systems are described in U.S. Pat. Nos. 3,497,356, 3,615,435, 3,926,643, and 2,670,286.

Additional suitable sensitizing compositions are disclosed in U.S. Pat. No. 4,101,323 which is incorporated herein by reference. These are compositions containing a compound (1) which splits off acid upon irradiation and a compound (2) having at least one group selected from the group consisting of a carboxylic ortho acid ester group and a carboxylic acid amide acetal group. Such a composition, upon irradiation, forms an exposure product having a higher solubility in a liquid developer than the non-irradiated composition.

It is to be emphasized that the sensitizers, colorants, optional binders, support materials and techniques for coating are all conventional in the art of preparing proofing foils.

To determine the suitability of previously known sensitizers or sensitizer systems with the anionic surfactants of this invention, a formulation of colorant, sensitizer, binder, and solvent is made wherein the components, particularly the sensitizer, is used to a level already commonly known to be satisfactory. This is the reference formulation, or control. Replicate formulations are made which contain progressively greater amounts of a preferred surfactant, e.g. GAFAC® RE-610. Such amounts may be, on a dry solids basis, 1%, 10%, 20%, and 30%. These amounts are not critical but are suggested for screening purposes. Such techniques are well known to artisans. The solution is examined for completeness. Coatings are made and examined for compatibility; there should be no phase separation.

Next, these coatings are exposed under an actinic source for the same period, and then developed in the customary developer for the system which contains no surfactant. The artisan may observe whether one of the series containing surfactant develops faster than the control, and at which level of surfactant content the image is attacked, indicating excessive surfactant. An effective level of surfactant is one at which improved developability is observed. In general, lower levels of surfactant are desirable with negative working system, while with positive working systems higher levels can be tolerated or are actually necessary for effectiveness.

Developability is interrelated to apparent emulsion speed, especially in positive systems. Here, the addition of surfactant improves the developability, which benefit reflects itself in a lessened exposure time. In negative systems the presence of surfactant apparently enhances access of developer to the exposed coating so that the benefit shows as increased development speed. In either case, the effect makes possible the control of exposure of constant developer time or the control of developer time with contant exposure so that each color foil for multicolor proofing may be processed in automatic equipment with no need for individual adjustment of exposure or development time; the adjustments having been made during manufacture.

The light sensitive coating compositions containing the anionic surfactant may be most conveniently applied to the film substrate by forming a solution or dispersion of the coating ingredients in a suitable solvent, applying the desired quantity of the solution to the surface of the film by any suitable technique such as roller coating, dip coating, doctor blade coating or whirler coating, and drying to evaporate the solvent. The dry coating thickness is preferably in the range of about 0.1 to about 10 microns. Suitable solvents which may be employed should be selected based on the solubility characteristics of the light sensitive compositions and include dimethyl sulfoxide, dimethyl formamide, tetrahydrofuran, glycol ethers such as ethylene glycol monomethyl ether and ethylene glycol mono ethyl ether, esters such as ethyl acetate, butyl acetate and amyl acetate; ketones such as methyl ethyl ketone, cyclohexanone and diacetone alcohol, and mixtures of these.

The composition of the coating on a dry weight basis shall range in the order of about 0.5% to 60% by weight of surfactant, an effective amount of colorant, generally in the range of about 1% to 40% by weight, and of course, effective amounts of the light sensitive materials as are known in the art.

The concentration of the solids in the coating solution prior to application to the substrate and drying depends upon the coating method used in depositing and coating, but generally solutions containing from about 2% to 20% by weight solids are satisfactory.

Exemplary of transparent film substrates to which the coating may be applied are those polymeric films manufactured from polymers containing polar groups in or pendant the polymer chain such as polyesters, cellulose acetate and polyvinyl chloride. Such films generally have a thickness of from about 1–5 mils, preferably about 2–3 mils. The adhesion characteristics are maximized when a polyester film material is employed.

The dried presensitized foils, which are colored by the dye applied to them, are exposed to ultraviolet light under a screened color separation silver film transparency which has been produced in a copying camera from a colored original. With a positive working proofing foil, a positive transparency is used.

After exposure, the light decomposition product and the dye are removed from the non-image areas by treatment with a weakly alkaline solution, which normally contains 0.5% to 5% by weight of an alkaline substance. Examples of such substances are alkali metal silicates, alkali metal phosphates, alkali metal carbonates, and organic bases such as ethanolamines, alkylamines, and alkylene diamines. The developed films are dried. When they are superimposed in precise register, a colored image is obtained which either corresponds exactly to the multicolored original or, alternatively, renders possible a rapid correction of the silver films by any of the conventional after-treatments.

After exposure and development, the colored foil is overall exposed to destroy the yellowish color due to residual sensitizer in the image.

The following examples are illustrative of the invention.

EXAMPLE 1

A coating solution was prepared according to the following composition.

acrylic polymer—5.1 g.
Orasol Yellow 3GLG (Ciba-Geigy)—0.86 g.
Orasol Black RL (Ciba-Geigy)—6.02 g.
o-quinone diazide—12.04 g.
GAFAC® RE-610 (GAF Corp.)—6.00 g.
GAFAC® RE-610 is an acid ester of mono and diesters of phosphoric acid. It has a specific gravity at 25° C. of 1.10–1.12, a pour point (ASTM) of <0° C. and an acid number of 62–72.

The acrylic polymer was dissolved in methyl cellosolve (monoethyl ether of ethylene glycol). To this solution was added the remaining ingredients. The solution was stirred for about one hour, filtered, and coated on a 3 mil film of biaxially-oriented transparent polyethylene terephthalate and dried. The resulting sheet was employed as a black positive color proofing film which is dry and tack-free. Its reflectance is 11.5 on the Hunter L scale. These tests were performed using a Hunter Lab Model D25D3P Color Difference Meter in accordance with the Instruction Manual provided with that unit. It was exposed through a positive color separation and a √2 Stouffer stepwedge sensitivity guide for 20 units (ca. 20 seconds) in a Berkey/Ascor (24"×28") vacuum exposure frame. The exposed sheet was developed with an aqueous alkaline developer which removes the exposed areas, leaving the unexposed areas as image. The image areas showed no signs of developer attack. The sheet was rinsed with tap water and blotted dry. A clear 2 on the stepwedge was obtained. The film was post-exposed for 20 units. A positive half-tone black proofing image resulted.

The clear base had a reflectance of 87 on the Hunter L scale. The density was adjusted by choice of coating thickness. A reflectance of 11.5 on the Hunter L scale is seen subjectively as a very dense, deep black.

EXAMPLE 2

The procedure of Example 1 was followed except that the surfactant was omitted. After drying the coating on the support film, a reflectance of 12 on the Hunter L scale was obtained, substantially identical to the reflectance of the sheet of Example 1 and subjectively indistinguishable. The sheet was also dry and tack-free. In order to obtain a clear 2 on the √2 Stouffer stepwedge, an exposure of 320 units was required.

EXAMPLE 3

The procedure of Example 1 was followed except that the surfactant was omitted and the reflectance of the film was adjusted to 21 on the Hunter L scale. An exposure of 40 units was required to obtain a clear Step 2 on the Stouffer scale. The sheet was visually perceived to be no more than a medium to dark gray which nevertheless still required double the exposure of the sheet of Example 1.

EXAMPLE 4

The procedure of Example 1 was followed except that the acrylic polymer was omitted. There were no observable differences in the results.

EXAMPLE 5

The procedure of Example 1 was followed except that GAFAC® PE-510 was used as the surfactant and Lytron 820 (copolymer of styrene-maleic) was used as a binder instead of acrylic polymer. GAFAC® PE-510 is also an acid ester and is a mixture of mono and diesters of phosphoric acid. A dry tack-free film was obtained. An exposure of 30 units was required to obtain a clear Step 2 on the Stouffer scale.

EXAMPLE 6

Instead of GAFAC® RE-610 as described in Example 1, 4 g. of GAFSTAT® AS-710 was used and the binder resin was eliminated. GAFSTAT® AS-710 is a free acid of complex phosphate esters. It has a specific gravity at 25° C. of 1.05, a pour point ASTM of 18° C. and an acid number of 58–70. The unexposed sheet was dry and tack-free and an exposure of 20 units (ca. 20 seconds) was used.

EXAMPLE 7

The procedure of Example 6 was followed except that the quantity of GAFSTAT® AS-710 was increased to 24 g. Although the sheet was dry and tack-free, there was some developer attack upon the image.

EXAMPLE 8

A solution of the following composition was prepared:
acrylic polymer—25.5
Orasol Yellow 3GLG—4.3
Orasol Black RL—30.1
Sensitizer System of U.S. Pat. No. 4,101,323—20.4

The acrylic polymer was dissolved in monomethyl ether of ethylene glycol. To this solution were added the remaining ingredients with stirring for about one hour. The resulting solution was filtered and spin coated onto a biaxially-oriented polyethylene terephthalate film to a density of 13±1 on the L scale using a Gardner XL-31 Digital tristimulus colorimeter. The coated sheet was exposed on a Berkey/Ascor exposure unit for 150 units (ca. 150 seconds) and treated with an aqueous alkaline developer. The sheet did not develop and no clear step showed.

EXAMPLE 9

The procedure and recipe of Example 8 was followed except that 30 g. of GAFAC® RE-610 was added to the coating composition. With the same exposure (150 units), treatment with developer cleaned out the non-image area. Overdevelopment resistance was good.

EXAMPLE 10

A. A coating solution was prepared by dissolving 0.604 grams of Orasol Yellow 3GLG. 0.452 grams of Rhodamine FB, 1.032 grams of Rhodamine 6GDN Extra, and 4.754 grams of o-quinone diazide in 49.00 grams of methyl cellosolve and 49.00 grams of methyl ethyl ketone. The solution was filtered and coated on a polyester film. This magneta positive color proofing film was exposed for 20 units. A clear 2 stepwedge was obtained after the film was developed with the same developer as in Example 1. Overdevelopment resistance was good.

B. GAFAC® Re 610 (0.6 g) was added to the coating solution of Part A of this example and then coated on the polyester film. With 20 units exposure, a clear 8 stepwedge was obtained, showing 6 steps of increase in exposure speed. Overdevelopment resistance was poor.

EXAMPLE 11

A. Victoria Pure Blue FGA, 1.176 grams, and o-quinone diazide, 2.858 grams, were dissolved in 24.70 grams of methyl cellosolve and 74.12 grams of methyl ethyl ketone. This coating solution was coated on polyester film. This cyan positive color proofing film was exposed for 20 units, then developed with the developer of Example 1. A clear 2 stepwedge was obtained.

B. The procedure of Part A of this example was used except that 0.5 grams of GAFAC® RE-610 was added to the coating solution. The coated film gave a clear 4 stepwedge with 20 units of exposure showing a 2-step increase in exposure speed. Overdevelopment resistance was good.

EXAMPLE 12

The procedure of Example 8 was followed except that instead of the sensitizer used therein, 60.2 g. of o-quinone diazide was used and the exposure was reduced to 20 units on a Berkey/Ascor exposure unit. The density of the coated sheet was also 13±1 on the L scale. After treatment with the developer the background area was not completely clean and no clear step showed.

EXAMPLE 13

The procedure of Example 12 was followed except that an anionic complex phosphate ester was added to the recipe to determine its range of effectiveness. The amounts were selected to become 10%, 15%, 20%, 30%, 40%, 50%, and 60% by weight on the basis of the dry solids content of the overall coating. The surfactants chosen for the experiments were:

GAFAC® RE-610
GAFAC® PE-510
GAFAC® RA-600
GAFAC® BH-650
GAFAC® BG-510
GAFAC® RS-410
GAFAC® RS-710
GAFAC® BI-750
GAFAC® RE-870
GAFAC® RM-710
Findet GC
Findet SR
Findet OJ-P The designation of the surfactant, the chemical type, the acid number, specific gravity at 25° C., and pour point, ASTM are given in the following table.

In all cases, the coating thickness was adjusted to yield an L value of 13±1 as measured on the Gardner XL-31 Digital tristimulus colorimeter. Also in all cases, an exposure of 20 units on a Berkey/Ascor exposure unit was used. A standard development was used in all cases, using an aqueous alkaline development.

Observations were made on the number of the clear steps shown after development, compatibility of the sheet, attack on the image or coating by the developer. The observations are noted in the appropriate spaces in the Table.

Not all proportions of surfactant were used. An omission of a specific proportion of surfactant; e.g., 15%, 30%, 40%, etc. is shown by a dash in the appropriate space.

| Surfactant (wt.) | Type | Chemical Composition | Acid # | Specific Gravity @ 25° C. | Pour Point ASTM | Amount of Surfactant | | | | | | |
|---|---|---|---|---|---|---|---|---|---|---|---|---|
| | | | | | | 10% | 15% | 20% | 30% | 40% | 50% | 60% |
| GAFAC® RE-610 | Anionic (Aromatic) | Acid ester mono & diesters of phosphoric acid | 62–72 | 1.10–1.12 | <0° C. | <1 Step | Clear 1 | (Best) Clear 2 | Clear 4 | Coating Adhesion Poor | Washed Off Coating Adhesion Poor | — |
| GFAC® PE-510 | Anionic (Aromatic) | Acid ester mono & diesters of phosphoric acid | 49–59 | 1.08–1.09 | 20° C. | — | — | — | — | Clear 2 | — | Coating Adhesion Poor |
| GAFAC® RA-600 | Anionic (Aliphatic) | Acid ester mono & diesters of phosphoric acid | 100–115 | 1.06–1.08 | <0° C. | — | — | — | — | Clear 2 | — | — |
| GAFAC® BH-650 | Anionic (Aliphatic) | Acid ester mono & diesters of phosphoric acid | 370–390 | 1.36–1.38[1] | <5° C. | Poor But Shows Slight Effect | — | Incompatible | — | — | — | — |
| GAFAC® BG-510 | Anionic (Aliphatic) | Acid ester mono & diesters of phosphoric acid | 215–235 | 1.19 | 25° C. | Shows Slight Effect | — | Image Washed Off | — | — | — | — |
| GAFAC® RS-410 | Anionic (Aliphatic) | Acid ester mono & diesters of phosphoric acid | 95–115 | 1.03–1.04 | −15° C. | Shows Slight Effect | — | Incompatible | — | — | — | — |
| GAFAC® RS-710 | Anionic (Aliphatic) | Acid ester mono & diesters of phosphoric acid | 58–70 | 1.04–1.06 | 18° C. | <1 Step | — | Incompatible | — | — | — | — |
| GAFAC® BI-750 | Anionic (Aliphatic) | Acid ester mono & diesters of phosphoric acid | 250–275 | 1.26–1.28[1] | <0° C. | <1 Step | — | — | — | — | — | — |
| GAFAC® RE-870 | Anionic (Aromatic) | Acid ester mono & diesters of phosphoric acid | 80–95 | 1.10–1.20[1] | 29° C. | <1 Step | Clear 2 | Clear 3 | — | — | — | — |
| GAFAC® RM-710 | Anionic (Aromatic) | Phosphate ester acid (similar to GAFAC®) | 33–41 | 1.06–1.08 | 15° C. | — | — | — | — | <1 Step Image Washed Off | 1–2 Step | Washed Off |
| Findet GC | Anionic | Phosphate ester acid (similar to GAFAC®) | 190 | 1.022 | N.A. | — | — | Not Developed | Slight Effect | Not Developed | Slight Effect | Precipitate |
| Findet SB | Anionic | Phosphate ester acid (similar to GAFAC®) | 160–175 | 1.0380 | N.A. | — | — | — | — | — | — | Hazy Image Washed Off |
| Findet OJ-P | Anionic | GAFAC® | 110–125 | 1.130 | N.A. | — | — | — | — | Clear 2 | — | — |

As noted in Experiment 12, in which no surfactant was used, the standard exposure of 20 units was insufficient to enable developer to clean the background or show any clear step on the Stouffer scale. Therefore, as in the series with GAFAC® RS-410, the surfactant although not as effective as, for example GAFAC® RE-610, nevertheless produced an increase in effective exposure speed compared to the control recipe which contained no surfactant.

EXAMPLE 14

Using the procedure of the previous example, a coating solution was prepared with the following composition:

| | |
|---|---|
| Lytron 820 | 2.3 g. |
| p-toluene sulfonic acid | 0.37 g. |
| calcogene-SFW unblended (yellow dye) | 1.67 g. |
| Rhodamine 6 GDN Extra | 0.68 g. |
| Victoria Pure Blue FGA | 0.60 g. |
| Sensitizer of U.S. Pat. 3,867,147 | 3.46 g. |
| Methyl cellosolve | 90.0 g. |

A duplicate formulation was made which additionally contained 0.50 g. of GAFAC® RE-610. Both were coated on a transparent terephthalate support, exposed in a Berkey/Ascor unit for 30 units (1 unit= about 1 sec.) and developed for 30 secs. in a dilute alkaline developer. The sample containing surfactant was developed completely; the other was only incompletely developed.

EXAMPLE 15

A coating solution was prepared according to the following composition:

| | |
|---|---|
| Lytron 820 | 1.0 g. |
| Victoria Pure Blue FGA | 0.1 g. |
| 1-(4'methylbenzene-1'-sulfonylimino) benzoquinone-1,4-diazide-4-n-(2'-ethylphenyl)-2-sulfonamide | 0.8 g. |
| Methyl cellosolve | 20 g. |

It was then coated on a 2 mil. film of biaxially-oriented transparent polyethylene glycol terephthalate and dried. A duplicate composition was made which additionally contained 0.1 g. of GAFAC® RE-610 (GAF Corp.). Both foils were exposed in a Berkey/Ascor (24"×28") exposure unit for 120 units and developed in a dilute alkaline developer. The first foil took 25 seconds to develop, the second 15 seconds.

EXAMPLE 16

A coating solution was prepared according to the following compositions:

| | |
|---|---|
| Polymethyl methacrylate/methacrylic acid=85/15 g. | |
| Trimethylolpropane triacrylate | 3.92 g. |
| 9-phenyl acridine | 0.75 g. |
| Acetosol Fire Red | 0.5 g. |
| Methyl cellosolve | 44.0 g. |

A second composition was prepared identical to the above except that it contained 0.11 g. of GAFAC® RE-610. Both were coated upon a transparent support and overcoated with polyvinyl alcohol solution, and exposed in a Berkey/Ascor development unit for 80 units. When development was conducted in a dilute aqueous developer for 5 seconds, the sample containing surfactant developed cleanly, while the other was incomplete. However, after 8 seconds of development, the surfactantfree sample also became clean.

What is claimed is:

1. A color proofing foil with improved developability comprising a sustantially transparent polmeric base sheet having a thin coating of a light sensitive composition adhered to a surface thereof, said light sensitive composition comprising a mixture of:
    (a) a colorant;
    (b) an organic light sensitive material; and
    (c) an anionic surfactant which is the reaction product of about one mole of $P_2O_5$ with about 2 to 4.5 moles of an alkylene condensation product of at least about one mole of oxide having 2-4 carbon atoms with one mole of a compound contaning about 6 to 150 carbon atoms and a reactive hydrogen atom and selected from the group consisting of phenol, alkyl phenols, aliphatic alcohols, fatty acids, fatty amines, fatty amides, rosin amines, long chain sulfonamides, long chain-substituted aryl sulfonamides, and high molecular weight mercaptans, said reaction product being prepared under substantially anhydrous conditions and at a temperature below about 110° C. down to about room temperature, the amount of said surfactant being sufficient to improve developability of said color proofing foil.

2. The color proofing foil of claim 1 where said alkylene oxide has two carbon atoms.

3. The color proofing foil of claim 2 where said anionic surfactant has the formula selected from those consisting of

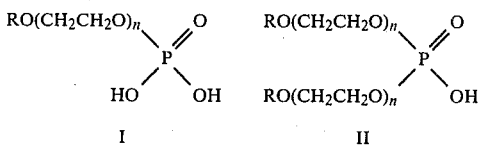

and mixtures thereof,
where R is alkyl or alkylaryl
n is 1–32

4. The color proofing foil of claim 1 wherein said surfactant has a specific gravity within the range of 1.00 to 1.40 at 25° C., a pour point, ASTM, within the range of <0° C. to 30° C., and an acid number within the range of 30 to 400 determined as mg of KOH per gram of product to the first inflection point (pH 5–5.5).

5. The color proofing foil of claim 2 wherein the surfactant has a specific gravity within the range of 1.04 to 1.25 at 25° C., a pour point, ASTM, within the range of <0° C. to 30° C., and an acid number within the range of 55 to 120 determined as mg of KOH per gram of product to the first inflection point (pH 5–5.5).

6. The color proofing foil of claim 1 wherein said light sensitive composition contains 0.5% to 60% by weight of surfactant, and effective amounts of colorant and light sensitive materials.

7. The color proofing foil of claim 1 wherein said base sheet has a substantially uniform thickness in the range of about 1 to 5 mils and said coating has a substantially uniform thickness in the range of about 0.1 micron to about 10 microns.

8. The color proofing foil of claim 3, wherein said organic light sensitive material is positive acting and wherein said anionic surfactant is present in an amount sufficient to increase exposure speed.

9. The color proofing foil of claim 3, wherein said organic light sensitive material is negative acting and wherein said anionic surfactant is present in an amount sufficient to increase development speed.

10. The color proofing foil of claim 9, wherein said organic light sensitive material is selected from the group consisting of diazonium compound and photopolymers.

11. The color proofing foil of claim 10 wherein the light sensitive material is a diazonium salt sensitizer.

12. The color proofing foil of claim 10, wherein the light sensitive material is a photopolymer.

13. The color proofing foil of claim 8, wherein said organic light sensitive material is selected from the group consisting of o-quinone diazides and a material comprising a compound:
  (1) which splits off an acid upon irradiation and a compound
  (2) having at least one group selected from the group consisting of a carboxylic acid amide acetal group, which composition upon irradiation forms an exposure product having a higher solubility in a liquid developer than the non-irradiated composition.

14. The color proofing foil of claim 13 wherein the light sensitive material comprises a compound (1) which splits off an acid upon irradiation and a compound (2) having at least one group selected from the group consisting of carboxylic ortho acid ester group and a carboxylic acid amide acetal group, which composition, upon irradiation, forms an exposure product having a higher solubility in a liquid developer than the non-irradiated composition.

15. The color proofing foil of claim 13, wherein the light sensitive material is an o-quinone diazide sensitizer.

16. The color proofing foil of claim 8 or 9 wherein said organic light sensitive material contains 0.5% to 60% of surfactant.

* * * * *